United States Patent [19]

Sugihara

[11] 4,409,543

[45] Oct. 11, 1983

[54] IMPEDANCE METER

[75] Inventor: Noriyuki Sugihara, Hachioojishi, Japan

[73] Assignee: Hewlett-Packard Company, Palo Alto, Calif.

[21] Appl. No.: 240,719

[22] Filed: Mar. 5, 1981

[30] Foreign Application Priority Data

Mar. 11, 1980 [JP] Japan .................................. 55-30740

[51] Int. Cl.³ .................... G01R 27/00; G01R 25/00; H03D 13/00
[52] U.S. Cl. .............................. 324/57 R; 324/83 Q; 324/83 R
[58] Field of Search ................. 324/57 R, 83 A, 83 R, 324/83 Q, 130

[56] References Cited

PUBLICATIONS

Hashimoto et al. "An Automatic ... LCR Meter" hp Journal-Sept. 76.
Maeda et al. "Multifrequency LCR Meters ... " hp Journal-Feb. 79.

Primary Examiner—Stanley T. Krawczewicz
Assistant Examiner—Jose M. Solis
Attorney, Agent, or Firm—Douglas A. Kundrat; Edward Y. Wong

[57] ABSTRACT

An apparatus is disclosed for determining the impedance and dissipation factor of a capacitive and/or inductive device and to reduce measurement error by digital calculation and manipulation. A synchronous rectifying means, a phase shifter and a detecting means are employed to detect the in-phase and orthogonal components of the current through a device and to compare it to a reference voltage impressed across the device. An arithmetical calculation using the values of these components determines the impedance and the dissipation factor of the device.

4 Claims, 5 Drawing Figures

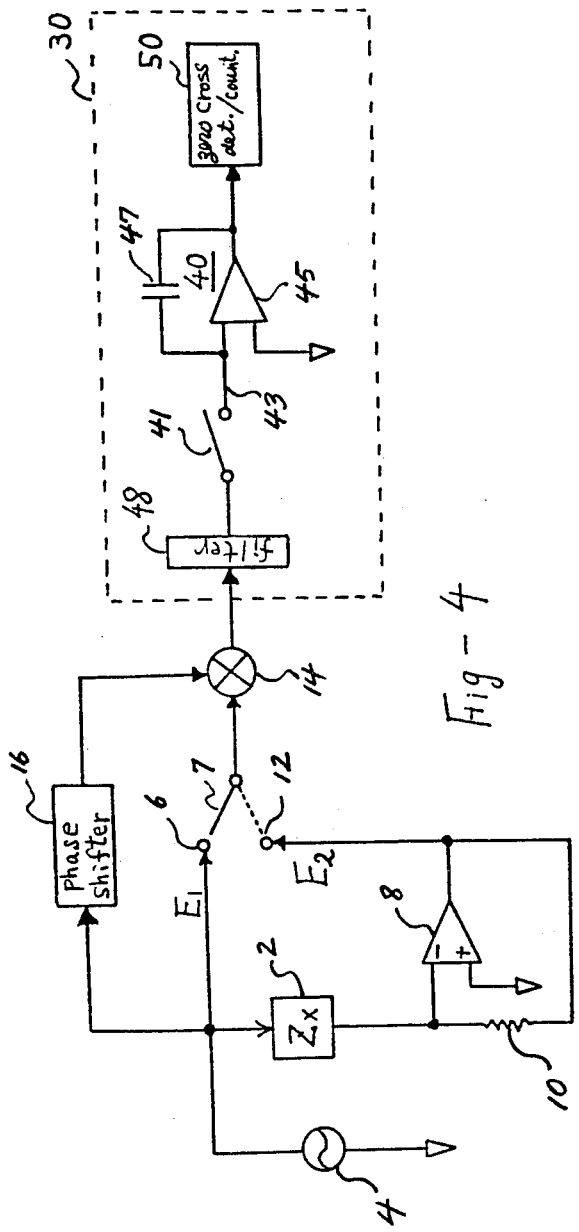
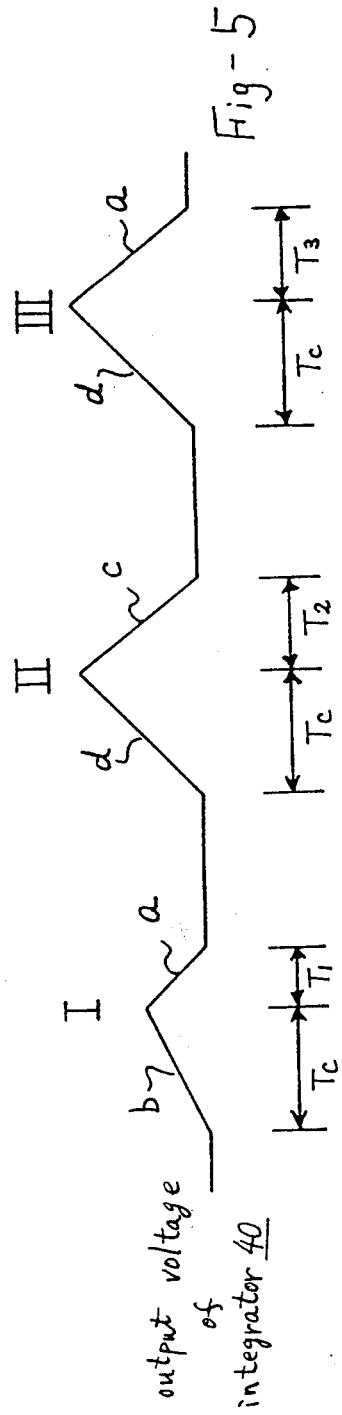

IMPEDANCE METER

BACKGROUND OF THE INVENTION

The present invention concerns an apparatus for measuring the impedance of an unknown device by phase comparison of the current through the device with the voltage across the device.

In prior art methods for measuring the impedance of an unknown device, to measure the phase difference of the current through the device and the voltage across the device, a phase detector, or a synchronous rectifier, has been employed. But the phase detector has the disadvantage of having a constant phase offset error. This phase error is an unavoidable measurement error, because the error is generated in part by the phase difference between the two signal input paths to the phase detector. This error is also generated in part by a residual phase error caused by the phase detector itself.

Another disadvantage to the prior art impedance meter is the difficulty of obtaining more accurate measurement and better resolution in the measurement of dissipation factors D, or $\tan\delta$ in the case of a capacitive impedance.

An apparatus for measuring the vector voltage ratio using a synchronous phase detector circuit and an analog circuit is shown in Japanese patent application number SHOWA No. 54-09358, entitled "An Apparatus for Measuring the Vector Voltage Ratio of Two A.C. Signals." The above cited application describes only the apparatus and method for measuring the vector ratio of two signals; it does not disclose a method for measuring impedance or dissipation factor D.

Accordingly, an object of the present invention is to provide an apparatus which can reduce measurement errors caused by phase detectors and which can increase accuracy and resolution in the measurement of the dissipation factor D of an unknown device.

SUMMARY OF THE INVENTION

An apparatus in accordance with the preferred embodiment of the present invention for measuring the impedance of an unknown device digitally removes measurement errors caused by the phase errors inherent in a synchronous phase detector circuit and by the signal paths to the synchronous phase detector circuit. This apparatus also digitally improves measurement accuracy and resolution of the dissipation factor D.

The apparatus in accordance with the preferred embodiment includes a conversion circuit that converts a current to a voltage. This current is a function of the impedance of the device and of the voltage impressed across the device. It also includes a switching circuit to selectively couple one of two a.c. input signals to an input terminal of a synchronous detector circuit.

A phase shifting circuit to shift the phase of one a.c. input signal is connected to another input terminal of the synchronous rectifying circuit.

A control circuit for selecting the input a.c. signal that the switching circuit is to couple and the amount of phase shift in the phase shifting circuit is also part of the apparatus. There is a voltage meter to measure the output voltage of the synchronous rectifying circuit. The output voltage of the synchronous rectifying circuit is then coupled to a calculating section to calculate the dissipation factor of the unknown device, thus forming an impedance measuring apparatus, or impedance meter.

DESCRIPTION OF THE DRAWINGS

FIG. 4 is a detailed block diagram of the apparatus of FIG. 1 having a dual-slope analog-to-digital converter as the voltage meter.

FIG. 5 shows a time plot of the output voltage of the integrator employed by the apparatus shown in FIG. 4.

DESCRIPTION OF THE PREFERRED EMBODIMENT

Figures 1, 2:
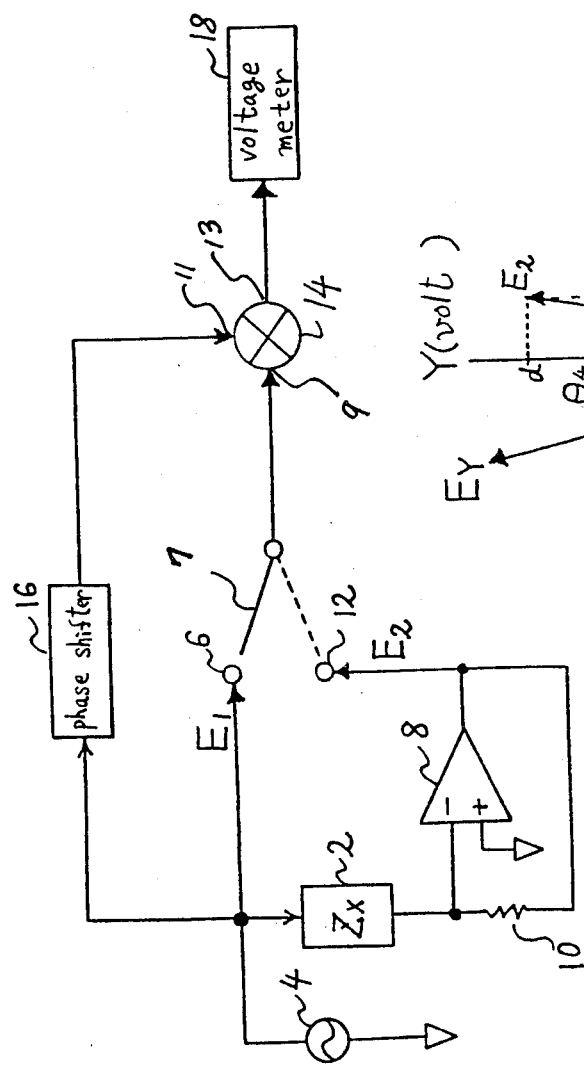
FIG. 1 is a block diagram of a preferred embodiment of the apparatus for measuring impedance in accordance with the invention.
FIG. 2 is a vector diagram showing the phase relation between input signals E1 and E2 and reference signals X and Y.

In FIG. 1, one terminal of a device 2 is connected to a reference oscillator 4 having an output voltage E and to an input terminal 6. The other end of device 2 is connected to the inverting input terminal of an operational amplifier 8. The inverting input terminal of operational amplifier 8 is also connected to a resistor 10; the other end of resistor 10 is connected to the output of operational amplifier 8. Operational amplifier 8 and resistor 10 together convert current that flows through device 2 to a corresponding voltage. In other words, operational amplifier 8 and resistor 10 together act as a current-to-voltage converter.

The output of operational amplifier 8, $E_2$, is connected to an input terminal 12. A switch 7 selectively couples input signal $E_1$ and input signal $E_2$ to an input terminal 9 of a phase detector 14. Input signal $E_1$ is also coupled to another input terminal 11 of phase detector 14 through a phase shifter 16.

A phase shifter 16 produces a square wave corresponding to input signal $E_1$ with a phase shift from input signal $E_1$ of either 0, $\pi/2$, $\pi$, or $3\pi/2$ radians. Phase shifters are known in the prior art. A control unit 19 selects the position of switch 7 and the amount of phase shift of phase shifter 16 as desired by a user. This phase shifter 16 can be embodied using the known technology. An output terminal 13 of phase detector 14 is coupled to a voltage meter 18, which measures the voltage of the output of phase detector 14. The values of the voltages are then calculated by a processor 21, such as a microprocessor or a calculator, to obtain the value of the impedance of device 2.

FIG. 2 is a vector diagram showing the phase relation between input signal $E_1$ and input signal $E_2$ of FIG. 1. In FIG. 2, vector $E_1$ corresponds to the voltage applied to input terminal 6, and vector $E_2$ corresponds to the voltage applied to input terminal 12. Here, vector $E_2$ corresponds to the magnitude and phase of the current that flows through device 2.

Due to the residual phase shift of the actual circuit, there is a residual phase difference $\theta_1$ between output voltage $E_1$ and the output voltage of phase shifter 16. This is evident when phase shifter 16 is set for a phase shift of 0 or $\theta$ radians. This phase difference $\theta_1$ can be attributed to the presence of phase shifter 16 in the signal path, if phase detector 14 is considered ideal and any contribution thereby to the phase difference $\theta_1$ is ignored.

Thus there is an inherent phase error $\theta_1$ in the phase difference between a reference vector X through phase shifter 16 and input signal $E_1$. Similarly, in the phase difference between reference vector X and input signal $E_2$, there is an inherent phase error $\theta_2$.

A vector $E_Y$ is made orthogonal to vector $E_1$. If device 2 is a test condenser with a certain loss, vector $E_2$ then corresponds to the flow of current through this test condenser. If the condenser is an ideal condenser, i.e., one with zero loss, the phase difference $\theta_4$ between vector $E_2$ and vector $E_Y$ will be zero, since the current through the condenser is leading its voltage $E_1$ by 90°. If there is any dielectric loss, phase difference $\theta_4$ then corresponds to the dielectric loss of the test condenser. This dielectric loss is generally designated tan$\delta$. When device 2 is an inductor, the phase difference $\theta_4$ then corresponds to a dissipation factor D of an inductor.

If device 2 is capacitive and it is expressed in parallel equivalent circuit terminology, viz., $C_p$ as parallel equivalent capacitance and $R_p$ as parallel equivalent resistance, the dissipation factor D (or tan$\delta$) can be expressed by the following relationship:

$$D = \frac{1}{\omega C_p R_p} = \frac{1}{Q},$$

where $\omega = 2\pi f$, and f is the frequency of interest to input signal $E_1$.

If device 2 is inductive and it is expressed in series equivalent circuit terminology, viz., $L_s$ as series equivalent inductance and $R_s$ as series equivalent resistance, the dissipation factor D (or tan$\delta$) can be expressed by the following relationship:

$$D = \frac{R_s}{\omega L_s} = \frac{1}{Q},$$

where $\omega$ and f are defined as above.

Figure 3:
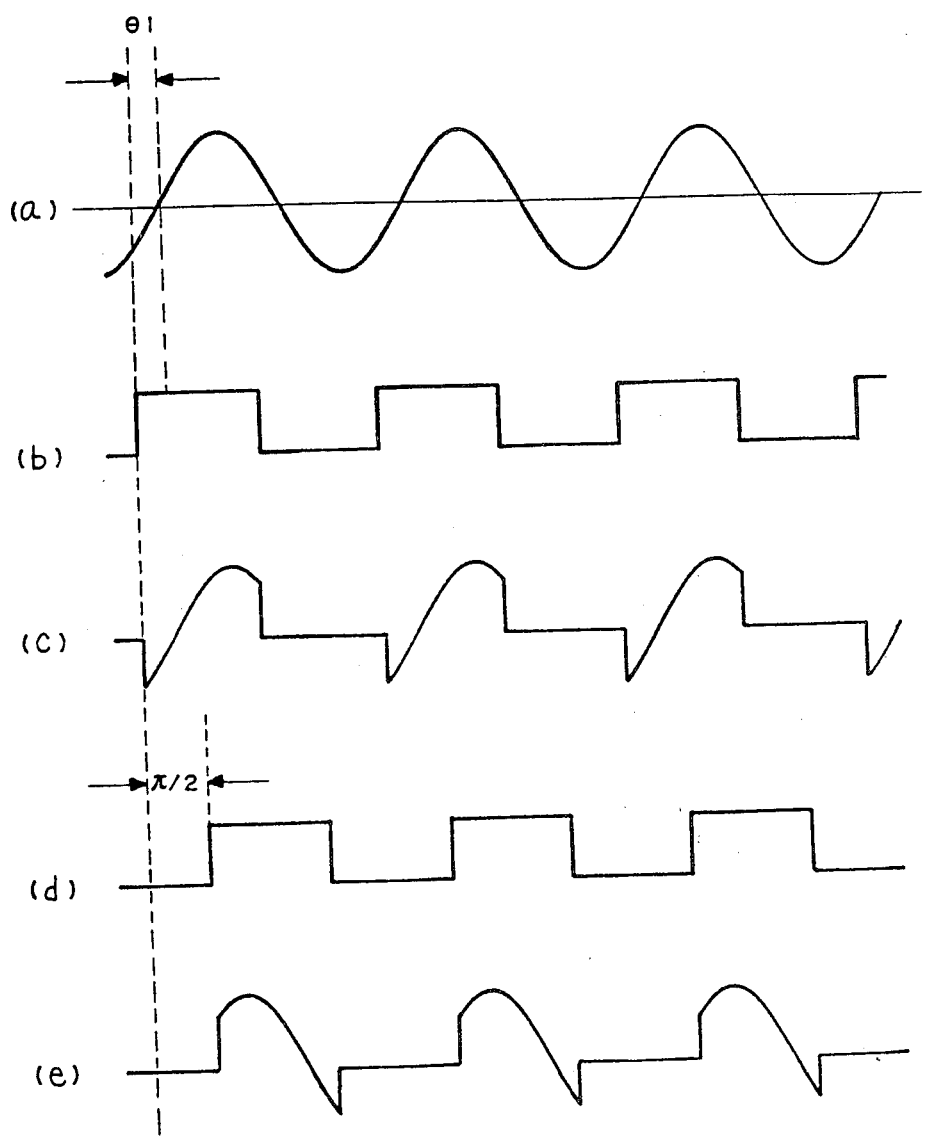
FIG. 3 shows the relation of the input and output signals of the phase detector employed in the preferred embodiment of the apparatus shown in FIG. 1.

FIG. 3 illustrates the operation of phase shifter 16 and phase detector 14 shown in FIG. 1.

FIG. 3(a) shows input signal $E_1$ and FIG. 3(b) shows the output of phase shifter 16 when the amount of phase shift is zero. $\theta_1$ is the phase difference between the signals shown in FIGS. 3(a) and 3(b). When switch 7 of FIG. 1 is connected to input terminal 6 and the output of phase shifter 16 shown in FIG. 3(b) is coupled to phase detector 14, phase detector 14 generates a detected signal shown in FIG. 3(c) which represents the component of input signal $E_1$ in phase with the output signal of FIG. 3(b). In terms of the vector diagram in FIG. 2, the output of phase shifter 16 shown in FIG. 3(b) and the detected signal shown in FIG. 3(c) correspond, respectively, to vector X and to magnitude "a" on reference vector X. FIG. 3(d) shows an output signal of phase shifter 16 when the amount of phase shift is $\pi/2$, and FIG. 3(e) shows the detected signal of phase detector 14 when input signal $E_1$ is coupled. In terms of the vector diagram illustrated in FIG. 2, the output of phase shifter 16 shown in FIG. 3(d) and the detected signal shown in FIG. 3(e) correspond, respectively, to a reference vector Y made orthogonal to vector X and to magnitude "b" on reference vector Y.

It is possible to analyze similarly the input signal $E_2$ illustrated in FIG. 2. Magnitude "c" with respect to reference vector X is detected by connecting switch 7 to input terminal 12 and setting phase shifter 16 for a phase shift of zero.

Magnitude "d" of $E_2$ with respect to orthogonal reference vector Y is detected by connecting switch 7 to input terminal 12 and setting phase shifter 16 for a phase shift of $\pi/2$.

The operation of the impedance meter in accordance with the preferred embodiment of the present invention can be better understood with a discussion of the theory underlying the method of measuring impedance in accordance with the invention. Such a discussion follows.

THEORY TO THE IMPEDANCE MEASUREMENT

Dissipation factor D is $$D = (1 + \alpha \cdot \beta)/(\beta - \alpha),$$

and reactance is $$X = \frac{\gamma}{\beta} \cdot \frac{\beta - \alpha}{1 + \alpha^2},$$

where $\alpha = b/a$, $\beta = d/c$, $\gamma = d/a$, and a, b, c, and d are as defined by the vector diagram in FIG. 2. This can be shown as follows:

It is evident from FIG. 2 that dissipation factor D of the device is $$D = \tan\delta$$

$$= \tan\theta_4$$

$$= \tan(\pi/2 - \theta_3)$$

$$= 1/\tan\theta_3.$$

But $$\tan\theta_3 = (\theta_2 - \theta_1) \quad (1)$$

$$= (\tan\theta_2 - \tan\theta_1)/(1 + \tan\theta_2 \cdot \tan\theta_1)$$

$$= (\beta - \alpha)/(1 + \alpha \cdot \beta),$$

so dissipation factor D becomes $$D = (1 + \alpha \cdot \beta)/(\beta - \alpha). \quad (2)$$

Similarly from FIG. 2, the reactance of the device is $$X = \frac{|E_2|}{|E_1|} \sin\theta_3, \quad (3)$$

where:

$$|E_1| = (a^2 + b^2)^{\frac{1}{2}}$$

$$= (a\sqrt{1 + \alpha^2})^{\frac{1}{2}}$$

$$|E_2| = (c^2 + d^2)^{\frac{1}{2}}$$

$$= a\left(\frac{\gamma^2}{\beta^2} + \gamma^2\right)^{\frac{1}{2}}.$$

Therefore, $$\frac{|E_2|}{|E_1|} = \frac{\alpha}{\beta}\left(\frac{1+\beta^2}{1+\alpha^2}\right)^{\frac{1}{2}} \quad (4)$$

From the identities $$1 + \cot^2\theta_3 = \csc^2\theta_3,$$

and $$1 + \frac{1}{\tan^2\theta_3} = \frac{1}{\sin^2\theta_3}$$

it follows that $$\sin\theta_3 = \left(\frac{1}{1+1/\tan^2\theta_3}\right)^{\frac{1}{2}} \quad (5)$$

Combining equations (1), (3), (4), and (5) results in the following relationship:

$$X = \frac{\gamma}{\beta} \cdot \frac{\beta - \alpha}{1+\alpha^2} \quad (6)$$

If the device is inductive, then $$X = j\omega L,$$

where $\omega = 2\pi f$ and L is the inductance.
If the device is capacitive, then $$X = \frac{1}{j\omega C},$$

where $\omega = 2\pi f$ and C is the capacitance.

The impedance of device 2 can be determined from equations (2) and (6). A microprocessor (not shown) is usually used to manipulate the parameters and to make the calculations called for by these equations.

FIG. 4 illustrates a detailed block diagram of an impedance meter in accordance with the preferred embodiment of the invention, and FIG. 5 illustrates a sequential timing diagram to explain the operation of FIG. 4. In this embodiment, a dual-slope voltage ratio meter 30 is used instead of a voltmeter 18 shown in FIG. 1. The output signal of phase detector 14 is transmitted to a smoothing filter 48 to produce a d.c. output signal which is coupled through a switch 41 to an input terminal 43 of an integrator 40. As illustrated in FIG. 4, integrator 40 includes an operational amplifier 45 and a feedback capacitor 47. The output of integrator 40 is coupled to a zero-crossing detector and counter 50.

In FIG. 5 the output voltage of integrator 40 is shown. Each of the steps in attaining this voltage is now discussed.

Step I

This is a step to measure a reference phase shift and to calculate $\alpha$.
(1) Switch 7 is connected to input terminal 6.
(2) Phase shifter 16 is set for a phase shift of $\pi/2$.
(3) Switch 41 is next applied and the signal coupled thereby is allowed to be integrated for a predetermined period of TC seconds. This step corresponds to "b," the orthogonal component of input signal $E_1$, being integrated for Tc seconds.
(4) Phase shifter 16 is next set for a phase shift of $\pi$. It should be noted that switch 7 remains connected to input terminal 6 during this integration of "$-a$" volts.
(5) Finally, when the output voltage of integrater 40 falls to a predetermined level, switch 41 is switched off.

This interval is denoted as $T_1$. By calculating $T_1/Tc$, and from the relationship $b/a = T_1/Tc$, $b/a = \alpha$ can be determined.

Step II

This step measures $\tan\delta$ and calculates $\beta$.
(1) Switch 7 is connected to input terminal 12.
(2) Phase shifter 16 is set for a phase shift of $\pi/2$.
(3) Switch 41 is next applied and the signal coupled thereby is allowed to be integrated for a predetermined period of Tc seconds. This step corresponds to "d," the orthogonal component of input signal $E_2$, being integrated for Tc seconds.
(4) Phase shifter 16 is next set for a phase shift of $\pi$. It should be noted that switch 7 remains connected to input terminal 12 during this integration of "$-c$" volts.
(5) Finally, when the output voltage of integrator 40 falls to a predetermined level, switch 2 is then switched off.

This interval is denoted as $T_2$. By calculating $T_2/T_c$ and from the relationship $d/c = T_2/Tc$, $d/c = \beta$ can be determined.

Step III

This step measures capacitance or inductance and calculates $\gamma$.
(1) Switch 7 is connected to input terminal 12.
(2) Phase shifter 16 is set for a phase shift of $\pi/2$.
(3) Switch 41 is then applied and the signal coupled thereby is allowed to be integrated for a fixed time of Tc seconds. This step corresponds to "d," the orthogonal component of input signal $E_2$, being integrated for Tc seconds.
(4) Phase shifter 16 is next set for a phase shift of $\pi$, and switch 7 is simultaneously connected to input terminal 6. It should be noted that the integration of "$-a$" volts is accomplished during this period.
(5) Finally, when the output voltage of integrator 40 falls to a predetermined level, switch 41 is switched off.

This interval is denoted as $T_3$. By calculating $T_3/Tc$, and from the relationship $d/a = T_3/Tc$, $d/a = \gamma$ can be determined.

After $\alpha$, $\beta$ and $\gamma$ are determined by steps (I), (II) and (III), respectively, the dissipation factor D is calculated from equation (2) and the reactance, either capacitance or inductance, is calculated from equation (6) by a calculator, such as a microprocessor.

As the above discussion illustrates, the apparatus in accordance with the preferred embodiment of the invention provides precise measurements of dissipation factors D and reactance, both capacitive and inductive. It does so by essentially removing the effects of phase errors inherent in synchronous phase detectors.

I claim:
1. An apparatus for measuring an impedance or a dissipation factor of a device, the apparatus comprising:
a reference oscillator, having an output coupled to the device, for applying a first voltage signal across the device to yield a current;

a converter, coupled at an input to the device, for converting the current to a second voltage signal and for presenting said second voltage signal at an output;

a phase shifter, coupled at an input to the reference oscillator, for selectively shifting the phase of the first voltage signal by either 0 or 90 degrees in response to a control signal and for presenting the 0 degree shifted first voltage signal or the 90 degree shifted first voltage signal at an output;

switch means, having a first input coupled to the output of the reference oscillator and a second input coupled to the output of the converter, for selecting one of a first and a second position in response to a control signal, whereby the first voltage signal is presented at an output when the first position is selected and the second voltage signal is presented at the output when the second position is selected;

synchronous rectifying means, having a first input coupled to the phase shifter output and a second input coupled to the switch means output, for presenting at an output a rectified signal such that said rectified signal represents a phase difference between the shifted first voltage signal and the first voltage signal when the first position is selected and the rectified signal represents a phase difference between the shifted first voltage signal and the second voltage signal when the second position is selected;

control means, coupled to the phase shifter and to the switch means, for presenting control signals to the phase shifter and to the switch means;

detecting means, coupled to the output of the synchronous rectifying means, for detecting the rectified signal and for measuring a phase difference A when the first switch position and the 0 degree shifted first voltage signal are selected, a phase difference B when the first switch position and the 90 degree shifted first voltage signal are selected, a phase difference C when the second switch and the 0 degree shifted first voltage signal are selected, and a phase difference D when the second switch position and the 90 degree shifted first voltage signal are selected; and, calculating means, coupled to the detecting means, for calculating B/A, D/C, and D/A and for determining the device impedance or the dissipation factor therefrom.

2. An apparatus as in claim 1, wherein the detecting means comprises a dual-slope voltage ratio meter.

3. A method for measuring an impedance or a dissipation factor of a device, the method comprising the steps of:

generating a first voltage signal;

creating a current by impressing the first voltage signal across the device;

converting the current into a second voltage signal;

creating a 0 degree shifted first voltage signal by phase shifting the first voltage signal 0 degrees;

measuring a phase difference A between the first voltage signal and the 0 degree shifted first voltage signal;

measuring a phase difference C between the second voltage signal and the 0 degree shifted first voltage signal;

creating a 90 degree shifted first voltage signal by phase shifting the first voltage signal 90 degrees;

measuring a phase difference B between the first voltage signal and the 90 degree shifted first voltage signal;

measuring a phase difference D between the second voltage signal and the 90 degree shifted first voltage signal; and, calculating B/A, D/C, and D/A, and determining the device impedance or dissipation factor therefrom.

4. A method as in claim 3, wherein the steps of measuring a phase difference are performed with a dual-slope voltage ratio meter.

* * * * *

UNITED STATES PATENT AND TRADEMARK OFFICE
CERTIFICATE OF CORRECTION

PATENT NO. : 4,409,543
DATED : October 11, 1983
INVENTOR(S) : Noriyuki Sugihara

It is certified that error appears in the above—identified patent and that said Letters Patent is hereby corrected as shown below:

Column 2, line 64, delete "$\theta$" and insert --$\pi$--.

Column 5, line 66, delete "TC" and insert --Tc--.

Signed and Sealed this

Third Day of January 1984

[SEAL]

Attest:

GERALD J. MOSSINGHOFF

*Attesting Officer*  *Commissioner of Patents and Trademarks*